United States Patent
Folsom et al.

(10) Patent No.: US 10,151,788 B2
(45) Date of Patent: Dec. 11, 2018

(54) AUTONOMOUSLY POWERED INDUCTIVELY COUPLED TIME DOMAIN REFLECTOMETER SENSOR DEVICE

(71) Applicant: Savannah River Nuclear Solutions, LLC, Aiken, SC (US)

(72) Inventors: Matthew D. Folsom, Aiken, SC (US); Klaehn W. Burkes, Wagener, SC (US)

(73) Assignee: Savannah River Nuclear Solutions, LLC, Aiken, SC (US)

( * ) Notice: Subject to any disclaimer, the term of this patent is extended or adjusted under 35 U.S.C. 154(b) by 188 days.

(21) Appl. No.: 15/419,411

(22) Filed: Jan. 30, 2017

(65) Prior Publication Data

US 2018/0217195 A1    Aug. 2, 2018

(51) Int. Cl.
| | | |
|---|---|---|
| G01R 31/02 | (2006.01) | |
| G01R 31/08 | (2006.01) | |
| G01R 31/11 | (2006.01) | |

(52) U.S. Cl.
CPC ......... *G01R 31/026* (2013.01); *G01R 31/085* (2013.01); *G01R 31/11* (2013.01); *G01R 31/081* (2013.01); *G01R 31/083* (2013.01)

(58) Field of Classification Search
CPC ...... G01R 31/00; G01R 31/02; G01R 31/024; G01R 31/026; G01R 31/08; G01R 31/081; G01R 31/083; G01R 31/085; G01R 31/11
USPC ....... 324/500, 512, 522, 527, 532, 533, 534, 324/600, 629, 637, 638, 642, 646, 649, 324/654, 713, 76.11, 76.39, 76.75
See application file for complete search history.

(56) References Cited

U.S. PATENT DOCUMENTS

| | | | |
|---|---|---|---|
| 3,727,128 A | | 4/1973 | McFerrin |
| 3,771,049 A | * | 11/1973 | Piccione ............. G01R 31/021 |
| | | | 324/122 |
| 4,400,680 A | | 8/1983 | Heline, Jr. |
| 4,766,386 A | | 8/1988 | Oliver et al. |

(Continued)

FOREIGN PATENT DOCUMENTS

| | | |
|---|---|---|
| WO | WO 2006/025870 | 3/2006 |
| WO | WO 2010/116319 | 10/2010 |
| WO | WO 2015/168260 | 11/2015 |

OTHER PUBLICATIONS

Pasdar, "Real-Time Health Monitoring of Power Networks Based on High Frequency Behavior," Doctoral dissertation, University of Akron, Dec. 2014—187 pages.

(Continued)

*Primary Examiner* — Hoai-An D. Nguyen
(74) *Attorney, Agent, or Firm* — Dority & Manning, PA (57) ABSTRACT

Devices, systems and methods for use of an autonomously powered inductive time domain reflectometer sensor device are provided. A sensor device for a power line can include a first induction coil and a second induction coil coupled to the power line and a control device. The first induction coil can be configured to inject a first signal on a power line by inducing a first current on the power line. The second induction coil can be configured to inject a second signal on the power line by inducing a second current on the power line. The control device can be configured to control the second induction coil to inject the second signal to cancel a portion of the first signal. As a result of the second signal cancelling a portion of the first signal, the first signal can be configured to propagate in a single direction on the power line.

20 Claims, 9 Drawing Sheets

(56) References Cited

U.S. PATENT DOCUMENTS

| | | | |
|---|---|---|---|
| 6,097,755 | A | 8/2000 | Guenther, Jr. et al. |
| 6,825,672 | B1 | 11/2004 | Lo et al. |
| 7,845,848 | B2 | 12/2010 | Yakymyshyn et al. |
| 8,265,232 | B2 | 9/2012 | Lindqvist |
| 8,456,168 | B2 | 6/2013 | Hyde et al. |
| 8,988,099 | B2 | 3/2015 | Hall et al. |
| 9,210,257 | B2 | 12/2015 | Hall et al. |
| 9,250,283 | B2 | 2/2016 | Johnson et al. |
| 2010/0007354 | A1* | 1/2010 | Deaver, Sr. .......... G01R 31/025 324/539 |
| 2011/0012583 | A1* | 1/2011 | Hyde ................ H02J 3/16 323/355 |
| 2011/0181295 | A1 | 7/2011 | Haugen et al. |
| 2011/0316559 | A1 | 12/2011 | Haffner et al. |
| 2014/0357935 | A1* | 12/2014 | Ilmoniemi ............ A61N 2/006 600/13 |
| 2015/0042314 | A1* | 2/2015 | Imai .................... G01R 21/133 324/133 |
| 2015/0077131 | A1 | 3/2015 | Incarbone et al. |
| 2016/0341773 | A1* | 11/2016 | Reineccius ............ G01R 22/06 |
| 2017/0227594 | A1* | 8/2017 | Zhang .................. G01R 31/06 |

OTHER PUBLICATIONS

Divan et al, "Power Line Sensor Nets for Enhancing Line Reliability and Utilization," NSF Project ECS-0601423, Fourth and Final Progress Report, Apr. 2010, Georgia Institute of Technology—22 pages.

* cited by examiner

AUTONOMOUSLY POWERED INDUCTIVELY COUPLED TIME DOMAIN REFLECTOMETER SENSOR DEVICE

FEDERAL RESEARCH STATEMENT

This invention was made with Government support under Contract No. DE-AC09-085R22470, awarded by the U.S. Department of Energy. The Government has certain rights in the invention.

FIELD

The present subject matter relates generally to power systems, and more particularly to systems and methods for determining a parameter for a power line using an autonomously powered inductively coupled time domain reflectometer sensor device.

BACKGROUND

Time domain reflectometers ("TDRs") can be used to determine various parameters for power lines in a power system, such as distribution and transmission lines. For example, TDRs can be used to find fault locations along a power line, such as a fault location caused by a damaged conductor. In a typical application, a TDR can send a signal down a power line, and by measuring the time until the TDR receives a reflected signal from a discontinuity in the power line, a distance to a fault can be determined. Similarly, TDRs can be used to determine other parameters, such as line length for sections of the power line. Further, using known relationships, once a line length of a particular section has been determined, a temperature of the line or an amount of sag of the line can be determined.

However, typical TDRs are very large, and in many applications, TDRs must be connected as a terminating point on a power line. This may require the power line to be removed from operation in order for the TDR to be connected to the power line. For example, one or more breakers may need to be opened to electrically isolate the power line in order for the TDR to be connected as a terminating point on the power line, thereby taking the power line out of service. Moreover, connecting and operating a TDR may require a technician to manually connect the TDR to a line on an as-needed basis, thereby potentially requiring significant personnel time to set up and use the TDR. Thus, in many typical applications, conventional TDRs are not configured for autonomously determining parameters of a power line while the power line is operational, and using a conventional TDR may require significant personnel resources.

BRIEF DESCRIPTION

Aspects and advantages of embodiments of the present disclosure will be set forth in part in the following description, or may be learned from the description, or may be learned through practice of the embodiments.

One example aspect of the present disclosure is directed to a sensor device for a power line. The sensor device can include a first induction coil coupled to the power line. The first induction coil can be configured to inject a first signal on a power line by inducing a first current on the power line. The sensor device can further include a second induction coil coupled to the power line. The second induction coil can be configured to inject a second signal on the power line by inducing a second current on the power line. The sensor device can further include a control device. The control device can be configured to control the second induction coil to inject the second signal to cancel a portion of the first signal. As a result of the second signal cancelling a portion of the first signal, the first signal can be configured to propagate in a single direction on the power line.

Another example aspect of the present disclosure is directed to a method for determining a parameter of a power line. The method can include inducing, by a first induction coil of a first sensor device coupled to the power line, a first current to inject a first signal on the power line. The method can further include inducing, by a second induction coil of the first sensor device, a second current to inject a second signal on the power line. The second signal can be configured to cancel at least a portion of the first signal such that the first signal is configured to propagate in a single direction on the power line. The method can further include receiving, by either the first induction coil or the second induction coil of the first sensor device, a reflected signal. The reflected signal can be at least a portion of the first signal reflected back to the sensor device by a discontinuity in the power line. The method can further include determining, by a control device, a parameter associated with the power line based at least in part on the reflected signal.

Another example aspect of the present disclosure is directed to a power system. The power system can include a first power line, a first sensor device coupled to the first power line, and a control system. The first sensor device can include a first induction coil coupled to the power line. The first induction coil can be configured to inject a first signal on a power line by inducing a first current on the power line. The first sensor device can further include a second induction coil coupled to the power line. The second induction coil can be configured to inject a second signal on the power line by inducing a second current on the power line. The first sensor device can further include a control device. The control device can be configured to control the second induction coil to inject the second signal to cancel a portion of the first signal. As a result of the second signal cancelling a portion of the first signal, the first signal can be configured to propagate in a single direction on the power line. At least one of the first induction coil and the second induction coil can be configured to receive a reflected signal. A reflected signal can be at least a portion of the first signal reflected back to the first sensor device by a discontinuity in the first power line.

Variations and modifications can be made to these example aspects of the present disclosure.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

Example aspects of the present disclosure are directed to devices, systems and methods for determining parameters for a power line using an autonomously powered inductively coupled time domain reflectometer sensor device. For example, a sensor device for a power line can include a first induction coil, which can be coupled to the power line. The first induction coil can be configured to inject a first signal on the power line by inducing a first current on the power line. The sensor device can further include a second induction coil also coupled to the power line. The second induction coil can also be configured to inject a second signal in the power line by inducing a second current on the power line. The sensor device can also include a control device, which can be configured to control the second induction coil to inject the second signal to cancel a portion of the first signal. As a result of the second signal canceling a portion of the first signal, the first signal can be configured to propagate in a single direction on the power line.

The sensor device can further be configured to receive a reflected signal. For example, the first signal can propagate down the power line until it reaches a discontinuity. The discontinuity can be, for example, a discontinuity due to a damaged conductor, a fault, such as a fault caused by a foreign object in contact with the power line, or a discontinuity due to a power pole, such as at the end of a span of the power line. The first signal can reflect off of the discontinuity and propagate back towards the sensor device. An induction coil in the sensor device, such as the first induction coil or the second induction coil, can be configured to receive the reflected signal. In an embodiment, the control device of the sensor device can be configured to determine a parameter of the power line based at least in part on the reflected signal. For example the control device can be configured to determine a time duration of the reflected signal. As used herein, the phrase "time duration of the reflected signal" refers to a time period between a first signal being injected on the power line and a reflected signal being received by the sensor device.

Further, the control device can be configured to determine additional parameters, such as a length of the power line or a portion thereof, a temperature of the power line, a sag of the power line, or a fault condition of the power line. For example, a length of the power line can be determined based on known relationships and a time duration of the reflected signal. Similarly, due to known relationships between temperature, line length, line sag, and the time duration of the reflected signal, these parameters can be determined as well. A fault condition of the power line can also be determined, such as by receiving a reflected signal indicating a discontinuity at an unknown location on the power line. For example, the control device can be configured to compare the time duration of the reflected signal to known conditions, such as discontinuities at various locations on power line, such as at a plurality of power poles corresponding to spans of the power line. If the time duration of the reflected signal falls outside of a threshold with these known discontinuities, the control device can be configured to determine the location and existence of a fault condition on the power line.

The sensor device can further be configured to communicate a signal indicative of the parameter of the power line to a control system. For example, a control system can include one or more control devices and/or computing systems configured to measure various parameters on one or more power lines, and control power flows on the one or more power lines subject to various constraints, such as power ratings for the one or more power lines. The control system can be, for example, a control system in a control room operated by a power company. The sensor device can be configured to communicate a signal indicative of the parameter of the power line to the control system, such as by communicating a signal over the power line or by wirelessly communicating the signal indicative of the parameter of the power line. In an embodiment, the sensor device can be configured to communicate with a second sensor device, which can then be can figured to communicate the parameter to the control system.

In an embodiment, the control system can be configured to determine a power rating of the power line based at least in part on the parameter associated with the power line. Further, the control system can be configured to operate the power line based at least in part on the power rating. For example, a sensor device can communicate a signal indicative of a parameter of the power line, such as a time duration of the reflected signal, to the control system. The control system, using known relationships, can be configured to determine whether the line length of an individual span on the power line is increasing or decreasing. If the line length is increasing, the control system can determine that the temperature of the span is increasing, and further that the power line is experiencing increased sagging as a result of the increased temperature. Thus, in order to maintain appropriate current/power ratings, the control system can determine that the power rating of the power line should be decreased. Further, the control system can be configured to operate the power line based at least in part on the power rating such as, for example, by dispatching power generation units in a manner to ensure that the power rating of the power line is not exceeded.

The sensor device can further be configured to be coupled to the power line when the power line is transmitting power. Additionally, the sensor device can be configured to be powered from power received from the power line. For example, the sensor device can include a power control unit. The power control unit can be configured to provide power to the control device of the sensor device and further configured to store power received by the sensor device from the power line. For example, the power control unit can include an energy storage device, such as a battery, which can be configured to store power received by the sensor device from the power line. Further, the power control unit can be configured to provide power to the control device, which can further provide power to the first and second induction coils. Power can be received by the sensor device by, for example, a current in the power line inducing a current in the first or second induction coil, which can then be provided to the power control unit for storage.

A sensor device can also include a filter and amplifier associated with the each induction coil. For example, each filter can be configured to filter the power line waveform signal from a reflected signal received by an induction coil, so that the reflected signal can be measured by the control device. Each amplifier can be configured to amplify an injected signal induced on the power line by an induction coil. Similarly, the amplifier can be configured to amplify a reflected signal before the signal is provided to the control device. In an embodiment, the sensor device can also include analog-to-digital converters between the filters and/or amplifiers and the control device to convert analog signals to digital signals, and vice versa.

The signals injected by the sensor device can be high frequency induced current signals. As used herein, the term "high-frequency" means a signal at a frequency greater than about 10 kilohertz ("kHz"). As used herein, the term "about" means within 20% of the stated value.

In this way, the devices, systems, and methods according to example aspects of the present disclosure can have a technical effect of allowing for an autonomously powered, hot attachable TDR sensor device to be used to determine one or more parameters of a power line, and further allow a control system to operate the power line based on the parameters determined by the TDR sensor device. This can allow for real-time operational constraints to be determined and observed by the control system, which can increase the reliability of a power system while allowing for the power system to be operated at an increased threshold, such as, for example, by operating the power line subject to a real-time power rating. Further, faults and other operational parameters on the power line can be determined without the need for dispatching a technician or removing the line from service in order to attach a TDR device, which can reduce operational expenses while further increasing reliability of the power system.

Figure 1:
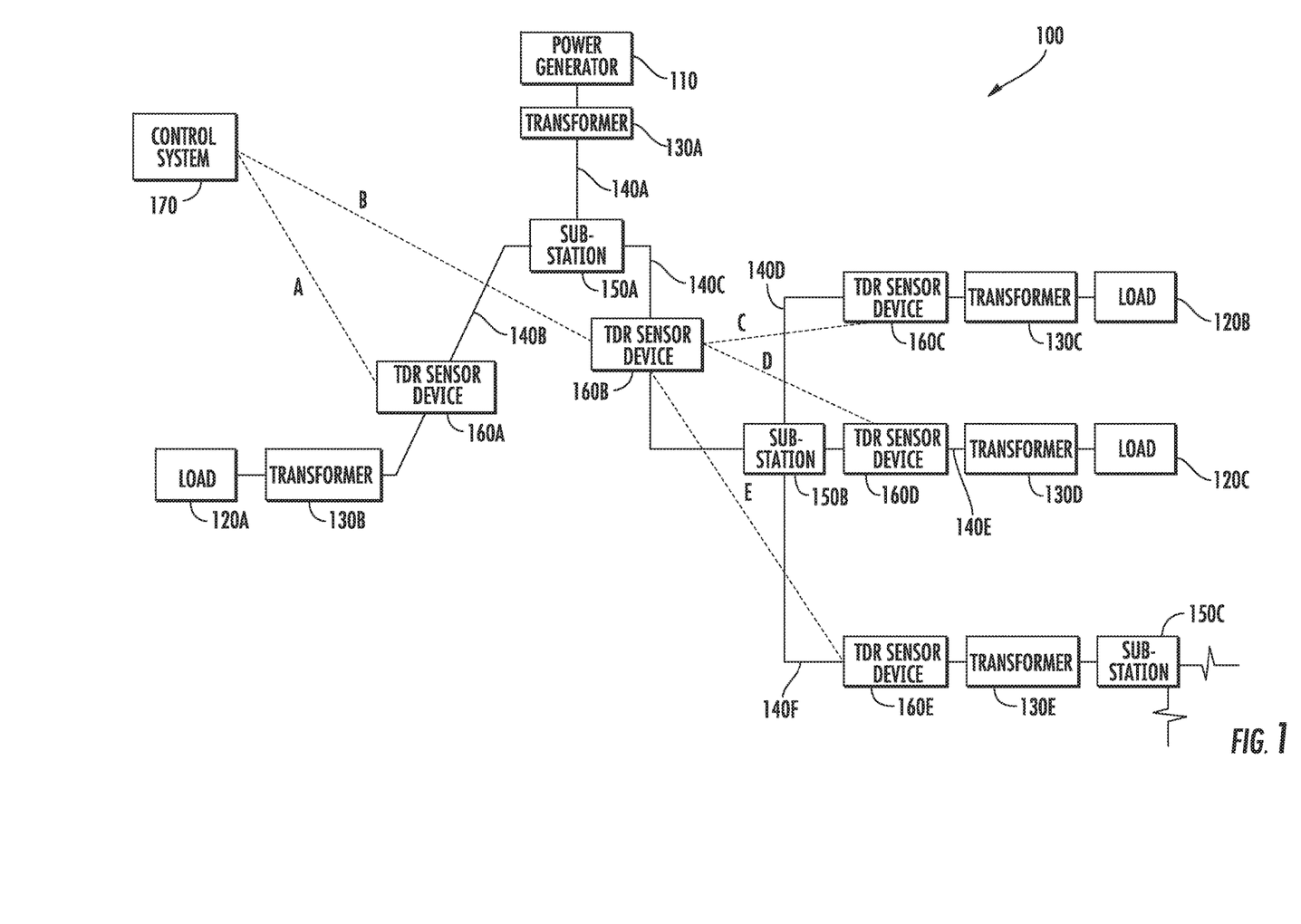
FIG. 1 depicts an example power system according to example aspects of the present disclosure.

With reference now to the figures, example aspects of the present disclosure will be discussed in greater detail. FIG. 1 depicts a power system 100 according to example aspects of the present disclosure. As depicted in FIG. 1, power system 100 can include a power generator 110, which can be configured to generate power for one or more loads 120 in the power system 100. Power generator 110 can be a large-scale power generator, such as a coal-fired power generation plant, a nuclear power generation plant, a utility scale wind farm, a utility-scale solar installation, a combustion turbine, a combined-cycle plant, or any other power generator. Additionally, power generator 110 can be a small-scale power generator such as a rooftop solar installation or a residential scale wind generator. Power generator 110 can be coupled to a transformer 130, which can transform the power generated by the power generator 110 into a form of power suitable for transmission along a power line 140. For example, each power line 140 can be a transmission line, such as a high-voltage transmission line, or a distribution line. Power line 140A can transmit power from the first transformer 130A to a first substation 150A. Additional power lines 140 can be connected to first substation 150A, such as second power line 140B and third power line 140C. Second power line 140B can transfer power from first substation 150A to a second transformer 130B to first load 120A. Third power line 140C can similarly transmit power from first substation 150A to second substation 150B. Fourth power line 140D can transmit power from second substation 150B to third transformer 130C to second load 120B. Fifth power line 140E can transmit power from second substation 150B to fourth transformer 130D to third load 120C. Sixth power line 140F can transmit power from second substation 150B to fifth transformer 130E to third substation 150C. Power system 100 is intended to depict various elements in a power system for illustrative purposes only. Those of ordinary skill in the art, using the disclosures provided herein, should understand that any number of power generators 110, loads 120, transformers 130, power lines 140, substations 150, and sensor devices 160 can be included in a power system 100.

As shown in FIG. 1, power system 100 can also include one or more TDR sensor devices 160. For example, as depicted in FIG. 1, a first TDR sensor device 160A can be coupled to second power line 140B, a second TDR sensor device 160B can be coupled to a third power line 140C, a third TDR sensor device 160C can be coupled to fourth power line 140D, a fourth TDR sensor device 160D can be coupled to a fifth power line 140E, and a fifth TDR sensor device 160D can be coupled to sixth power line 140F. As will be described in greater detail herein, each TDR sensor device 160 can be configured to determine one or more parameters associated with each power line 140 to which the TDR sensor device 160 is coupled.

The power system 100 can also include a control system 170. Control system 170 can include one or more computing devices which can run software/program configured to control operation of the power system 100. For example, a control system 170 can be configured to determine one or more operational constraints for the power system 100, such as power ratings for individual power lines 140, dispatch parameters for power generators 110, and switching configurations such as, for example, operating various breakers throughout the power system 100 in order to electrically isolate or energize various power lines 140. The control system 170 can be, for example, a control room for an electrical utility company.

Each TDR sensor device 160 can be configured to communicate with the control system 170. For example, as depicted by the dotted line A, first TDR sensor device 160A can be configured to communicate directly with control system 170, and as depicted by the dotted line B, second TDR sensor device 160B can be configured to communicate directly with control system 170. For example, a TDR sensor device 160 can be configured to wirelessly communicate with control system 170 using any suitable wireless communication protocol. For example, each TDR sensor device 160 can be configured to communicate via WLAN, 2G, 3G, LTE, Bluetooth, or any other suitable wireless communication protocol. Additionally and/or alternatively, each TDR sensor device 160 can be configured to communicate via one or more communication cables. For example, each TDR sensor device can be configured to communicate using dedicated communication cables, such as electrical conductors, fiber-optic cables, CAT5 cables, or any other suitable communication cable. Additionally and/or alternatively, each TDR sensor device 160 can be configured to communicate one or more signals via a combination of wireless and/or wired networks. For example, in an embodiment, each TDR sensor device can be configured to communicate a signal over a power line 140 to a communication hub (not shown). The communication hub (not shown) and then be configured to communicate with the control system 170 via a wired or wireless network.

Additionally, each TDR sensor device 160 can be configured to communicate a signal to a second TDR sensor device 160. For example, as shown in FIG. 1, third TDR sensor device 160C, fourth TDR sensor device 160D, and fifth TDR sensor device 160E can each be configured to communicate with second TDR sensor device 160B as depicted by dotted lines C, D, and E, respectively. Further, second TDR sensor device 160B can be configured to communicate with control system 170, as depicted by dotted line B. In this way, each TDR sensor device 160C, 160D, and 160E can each be configured to communicate with the control system 170 by first communicating with a second sensor device, such as second TDR sensor device 160B.

Figure 2:
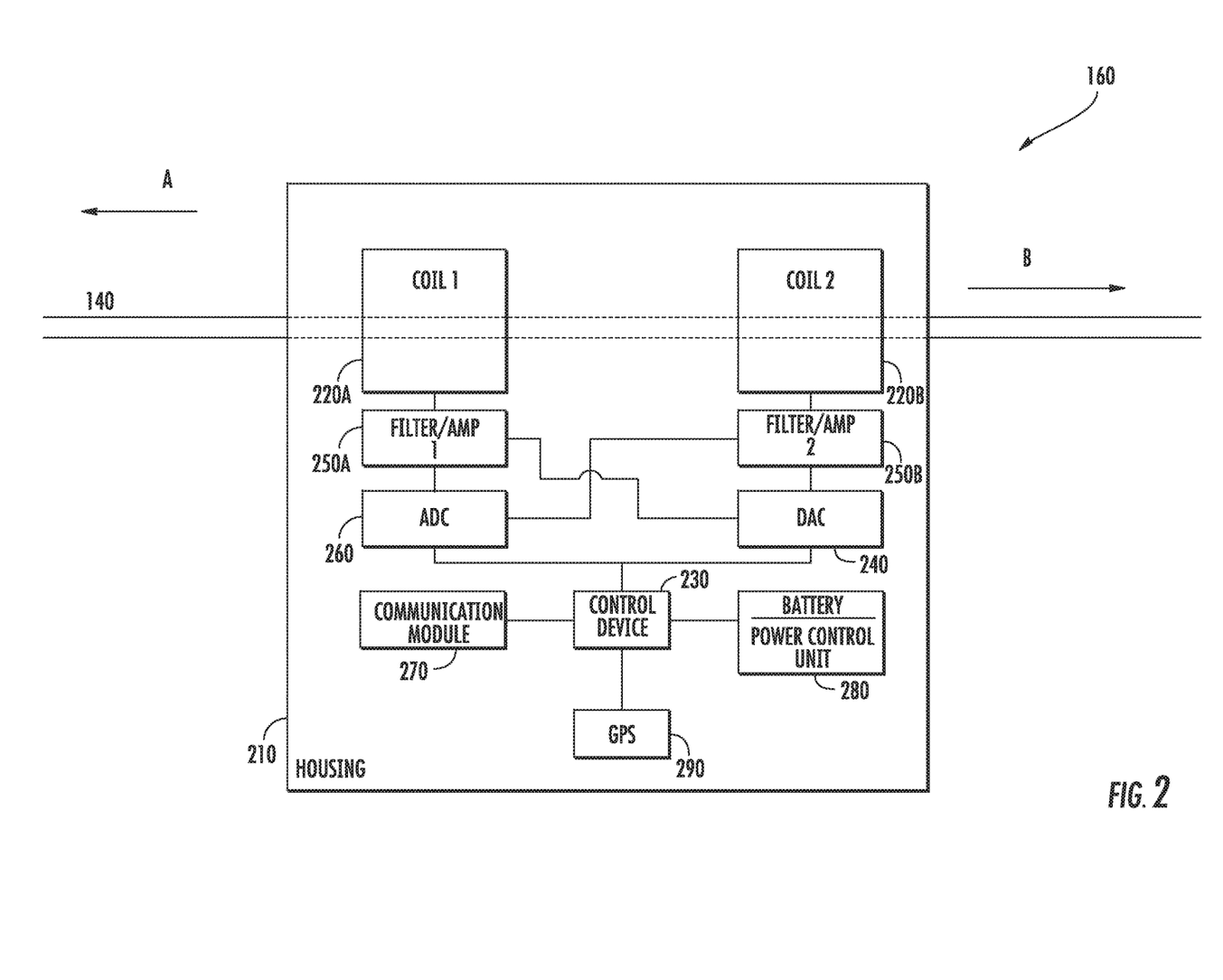
FIG. 2 depicts a block diagram of an example TDR sensor device according to example aspects of the present disclosure.

Referring now to FIG. 2, a block diagram depicting a TDR sensor device 160 according to example aspects of the present disclosure is depicted. The TDR sensor device 160 can be coupled to a power line 140. The TDR sensor device 160 can include a housing 210, which can house the components of the TDR sensor device 160. TDR sensor device can include a first induction coil 220A and a second induction coil 220B. Each induction coil 220 can be coupled to the power line 140. First induction coil 220A can be configured to inject a first signal on the power line by inducing a first current on the power line. The first signal can be, for example, a waveform or pulse, such as a sinusoidal waveform, a triangle waveform, a square waveform, another waveform, or a pulse. The second induction coil can be configured to inject a second signal on the power line by inducing a second current on the power line. In order to cancel a portion of the first signal, the second signal can be a signal of the same type as the first signal, for example, a waveform or pulse, such as a sinusoidal waveform, a triangle waveform, a square waveform, another waveform, or a pulse. Each induction coil 220 can inject a signal by being energized to induce a current on the power line 140.

The TDR sensor device 160 can also include a control device 230 and a digital to analog controller ("DAC") 240. Control device 230 can be configured to control the DAC 240 to send a signal to the first induction coil 220A and the second induction coil 220B. For example, the control device 230 can send one or more digital commands to the DAC 240, which can convert the digital signals to analog signals used to cause each induction coil 220 to induce a current on the power line 140, such as, for example, by energizing the induction coil 220. For example, a control device 230 can send a digital signal to the DAC 240 in order to induce a current from an induction coil 220 on the power line 140. The DAC 240 can be configured to convert the digital signal from the control device 230 into an analog signal suitable for use by the first induction coil 220A to inject a first signal by inducing a first current on the power line 140. Additionally, the control device 230 can be configured to control the DAC 240 to inject the second signal in the second induction coil 220B to cancel a portion of the first signal. As a result of the second signal canceling a portion of the first signal, the first signal can be configured to propagate in a single direction on the power line 140. In an embodiment, the DAC 240 and the associated functionality of the DAC 240 can be incorporated in and performed by the control device 230.

For example, first induction coil 220A and the second induction coil 220B can be spaced along the power line 140 such that the first induction coil 220A and the second induction coil 220B can simultaneously be controlled to induce a first current and a second current on the power line 140. However, due to the spacing of the induction coils 220 and the frequency of the injected signals, the second signal can be a signal 180° out of phase with the first signal. Thus, the second signal can counteract the first signal to cancel out the first signal, thereby preventing the first signal from propagating along the power line in the direction B. Thus, the first signal can be configured to propagate in a single direction A along the power line 140. In another embodiment, the control device 230 can be configured to control timing of the first induction coil 220A and the second induction coil 220B such that the second signal induced by the second induction coil 220B is delayed until the first signal has propagated to the second induction coil 220B, thereby cancelling a portion of the first signal. In this way, the first signal can similarly be configured to propagate in a single direction on the power line 140. In an embodiment, the first signal and the second signal can be high frequency induced currents.

Further, the first induction coil 220A and/or the second induction coil 220B can be configured to receive a reflected signal. For example, the first signal can propagate along the power line 140 until the first signal encounters a discontinuity on the power line 140. The discontinuity can be, for example, a discontinuity caused by a damaged conductor, a fault condition, such as a foreign object contacting the power line (e.g., a tree), or a power pole at the end of a span of the power line. Upon encountering the discontinuity, the first signal can reflect back along the power line 140 towards the TDR sensor device 160. The first induction coil 220A and/or the second induction coil 220B can be configured to receive the reflected signal, such as, for example, by the reflected signal inducing a current in the induction coil 220.

The control device 230 can be configured to determine a parameter of the power line 140 based at least in part on a reflected signal. For example, the control device can be configured to determine a time duration of the reflected signal by, for example, measuring the time between injecting a first signal on the power line 140 and receiving a reflected signal from the power line 140. Further, the control device can be configured to determine a length of the power line such as, for example, by using known relationships between the time duration of a reflected signal and the length of the power line or a portion thereof. Further, the control device can be configured to determine a plurality of parameters, such as the length of a plurality of spans of the power line, by receiving a plurality of reflected signals. For example, at each successive span of the power line, a portion of the first signal can be reflected back to the TDR sensor device 160. The TDR sensor device 160 can be configured to receive a plurality of reflected signals, wherein each reflected signal is indicative of a successive discontinuity in the power line. Using the plurality of reflected signals, the control device 230 can be configured to determine a plurality of parameters associated with the plurality of spans of the power line 140.

Moreover, the control device 230 can be configured to determine a temperature or other parameters of the power line using known relationships between the time duration of the reflected signal and the other parameters. For example, as a power line heats up, it can expand, or lengthen. As the power line expands, the time duration of a reflected signal can increase as compared to a baseline time duration of a reflected signal, and from this relationship, a control device 230 can be configured to determine various parameters, such as a length of the power line or a portion thereof, a temperature of the power line, or a sag of the power line or a portion thereof.

Similarly, a control device 230 can be configured to determine a fault condition of a power line 140. For example, the time duration of a reflected signal to known discontinuities in the power line can be known. If a time duration of a reflected signal falls outside of a threshold range associated with each known discontinuity, a control device 230 can be configured to determine that a fault condition has occurred, such as a contact by a foreign object (e.g., a tree). In this way, the control device 230 can be configured to determine one or more parameters of a power line based at least in part on a reflected signal.

The TDR sensor device 160 can further include a first filter/amplifier 250A associated with the first induction coil 220A and a second filter/amplifier 250B associated with the second induction coil 220B. Each filter of a filter/amplifier 250 can be configured to filter a reflected signal to remove any power waveforms from the reflected signal, such as a 50/60 Hz alternating current power waveform. Each amplifier of a filter/amplifier 250 can be configured to amplify an induced current injected onto the power line 140 by an induction coil 220, and further can be configured to amplify a reflected signal received by an induction coil 220.

The TDR sensor device 160 can further include an analog to digital converter ("ADC") 260 associated with the induction coils 220. The ADC 260 can be configured to convert one or more analog signals received from an induction coil 220, such as one or more analog reflected signals, into a digital signal suitable for use by the control device 230. For example, an induction coil 220 can receive a reflected signal on the power line 140, which can be an analog signal. The induction coil 220 can provide the analog reflected signal to the ADC 260, which can convert the analog reflected signal to a digital reflected signal, and provide the digital reflected signal to the control device 230. In an embodiment, the ADC 260 and the associated functionality of the ADC 260 can be incorporated in and performed by the control device 230.

The TDR sensor device 160 can further include a communication module 270. The communication module 270 can be, for example, a wired or wireless communication module configured to communicate with a control system 170, as described with reference to FIG. 1. The communication module 270 can be configured to communicate a signal indicative of a parameter of a power line, such as a parameter determined by a control device 230. The communication module 270 can be configured to communicate the signal indicative of a parameter of the power line to a control system 170 by either communicating directly with the control system 170, or by communicating with another TDR sensor device 160, which then communicates with the control system 170. In an embodiment, the communication module 270 and the associated functionality of the communication module 270 can be incorporated in and performed by the control device 230. In this way, the TDR sensor device 160 can be configured to communicate a signal indicative of a parameter of power line with a control system 170.

The TDR sensor device 160 can be configured to be coupled to the power line 140 when the power line is transmitting power (i.e., when the power line is "hot"). For example, the TDR sensor device 160 can be coupled to a power line 140 by a technician, such as during routine maintenance for the power line 140. Once coupled to the power line 140, the TDR sensor device 160 can remain on the power line 140 when the power line 140 is placed back into service. In this way, the TDR sensor device 160 can be configured to be coupled to the power line 140 when the power line 140 is transmitting power.

The TDR sensor device 160 can further include a power control unit 280. The power control unit 280 can be configured to provide power to the control device 230 and to other components of the TDR sensor device 160, such as the induction coils 220, the filter/amplifiers 250, the ADC 260, the DAC 240, the communication module 270, and other components. Further, the TDR sensor device 160 can be configured to be powered from power received from the power line 140. For example, in an embodiment, the induction coils 220 can be configured to receive power from the power line 140. For example, the power flowing in the power line 140 can induce a current in the induction coils 220 which can be provided to the power control unit 280, which can in turn provide power to various components of the TDR sensor device 160. Additionally and/or alternatively, the TDR sensor device 160 can be configured to be powered from power received from the power line 140 using any suitable means, such as by a third induction coil coupled to the power line 140 (not shown), which can be configured to receive power from the power line 140. For example, power received from the power line 140 can be provided to a power control unit 280, which can include an energy storage device, such as a battery. Other energy storage devices can similarly be used. The power control unit 280 can include a power converter, such as an AC to DC power converter configured to convert AC power from the power line to a DC power suitable for storage in the battery. Further, the power control unit 280 can be configured to provide energy stored in the battery to one or more components of the TDR sensor device 160. In an embodiment, the power control unit 280 and the associated functionality of the power control unit 280 can be incorporated in and performed by the control device 230. In this way, the TDR sensor device 160 can be configured to be powered from power received from the power line 140.

The TDR sensor device 160 can further include a GPS unit 290. The GPS unit 290 can be, for example, a GPS unit 290 configured to receive and/or provide one or more signals from a GPS system. Further, the GPS unit 290 can be configured to provide one or more GPS coordinates to a control system 170 for use in mapping and/or geo-locating the TDR sensor device 160 in a power system 100. In an embodiment, the GPS unit 290 and the associated functionality of the GPS unit 290 can be incorporated in and performed by the control device 230.

In an embodiment, the TDR sensor device 160 can further include one or more sensors, such as one or more temperature sensors, voltage sensors, current sensors, or other sensors (not shown). In an embodiment, the TDR sensor device can further be configured to communicate signals indicative of one or more measurements provided by the one or more sensors to a control system 170. In an embodiment, the one or more sensors and the associated functionality of the one or more sensors can be incorporated in and performed by the control device 230.

Figure 3:
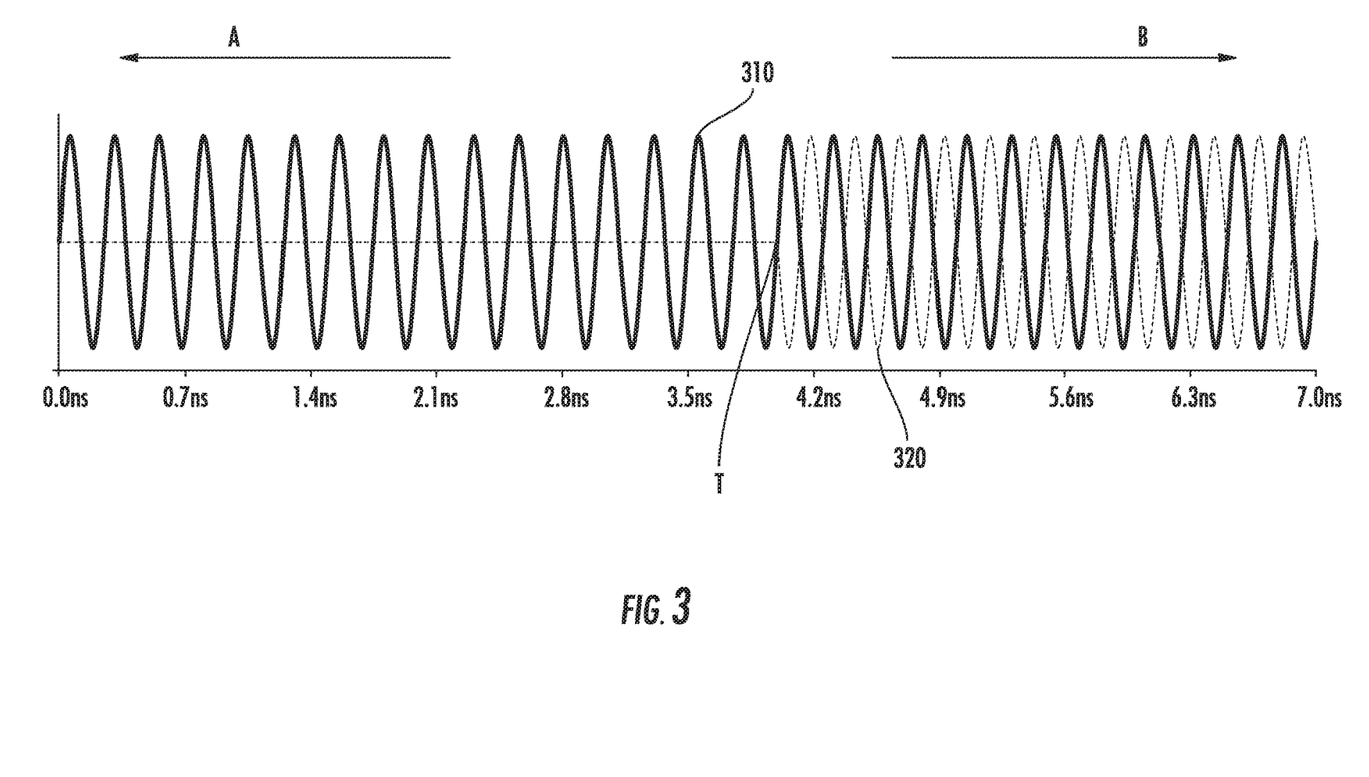
FIG. 3 depicts an example signal waveform generated by an example TDR sensor device according to example aspects of the present disclosure.

Referring now to FIG. 3, example signal waveforms generated by a TDR sensor device 160 are depicted. As discussed with reference to FIG. 2, a first induction coil 220A and a second induction coil 220B of a TDR sensor device 160 can be coupled to a power line 140. The first induction coil 220A can be configured to inject a first signal on the power line 140 by inducing a first current on the power line 140. Similarly, the second induction coil 220B can be configured to inject a second signal on the power line 140 by inducing a second current on the power line 140. The signals can be, for example, any number of signals configured to propagate along the power line 140. For example, the signals can be a sinusoidal waveforms, triangular waveforms, square waveforms, square pulses, sinusoidal pulses, triangular pulses, or any other waveform or pulse configured to propagate along the power line 140. The second signal can be configured to cancel a portion of the first signal. As a result, the first signal can be configured to propagate in a single direction on the power line 140. As used herein, a first signal can be "configured to propagate in a single direction" when a second signal cancels at least a portion of the first signal such that the signal generally propagates in a single direction along the power line. One of ordinary skill in the art will understand that it is not necessary for the second signal to completely cancel out the first signal in order for the first signal to propagate in a single direction along the power line.

For example, as depicted in FIG. 3, the first waveform can be a first sinusoidal waveform 310 induced by first induction coil 220A, and the second waveform can be a second sinusoidal waveform 320 induced by the second induction coil 220B. The first signal and the second signal can each be a high-frequency induced current signal. When the first induction coil 220A induces the first sinusoidal waveform 310, the first sinusoidal waveform 310 will tend to propagate along power line 140 in both the first direction A and the second direction B, as depicted in FIG. 2. However, second sinusoidal waveform 320 can be configured to cancel at least a portion of first sinusoidal waveform 310. For example, as shown in FIG. 3, second sinusoidal waveform 320 is essentially a zero signal until time T, but thereafter second sinusoidal waveform 320 becomes a sinusoidal waveform with the same amplitude and frequency as first sinusoidal waveform 310, but second sinusoidal waveform 320 is 180° out of phase with first sinusoidal waveform 310.

Figure 4:
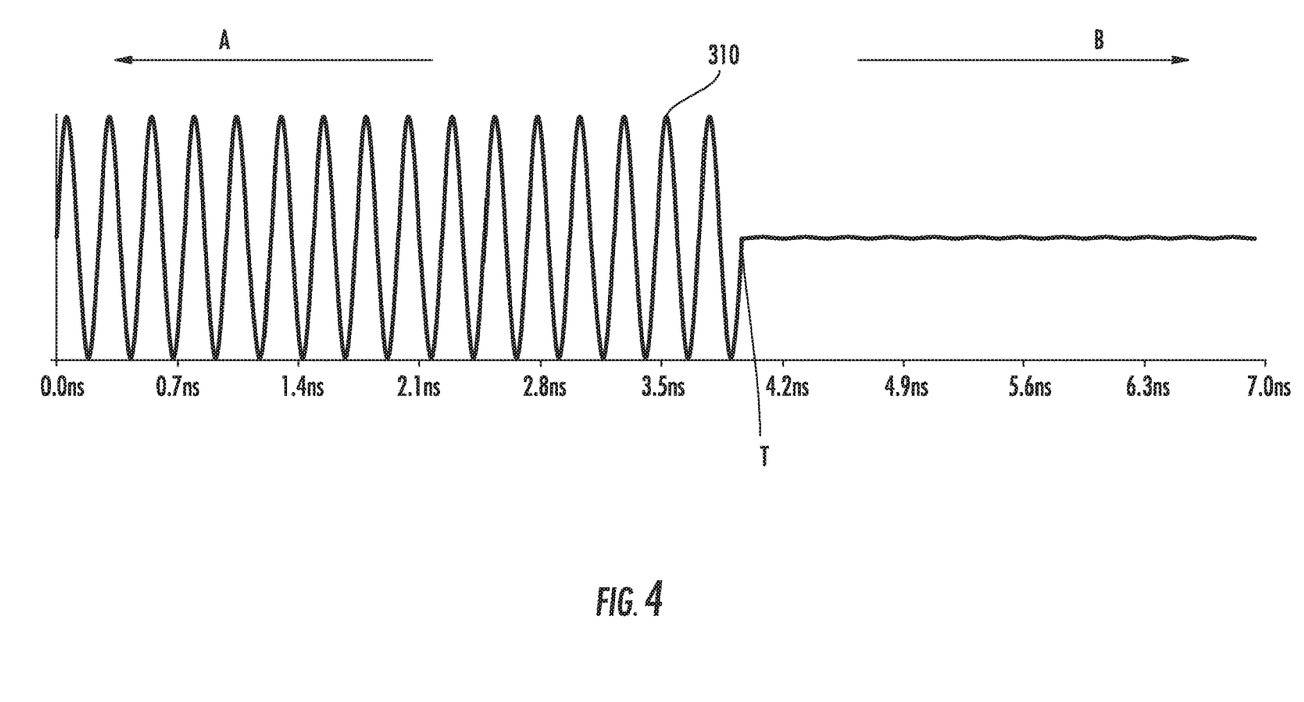
FIG. 4 depicts an example signal waveform generated by an example TDR sensor device configured to propagate in a single direction according to example aspects of the present disclosure.

Referring now to FIG. 4, an example signal waveform showing the summation of first sinusoidal waveform 310 and second sinusoidal waveform 320 is depicted. As shown, first sinusoidal waveform 310 is a generally sinusoidal waveform that propagates until time T. However, at time T, when second sinusoidal waveform 320 begins to be a sinusoidal waveform 180° out of phase with first sinusoidal waveform 310, second sinusoidal waveform 320 cancels out a portion of first sinusoidal waveform 310. For example, as shown in FIG. 4, first sinusoidal waveform 310 essentially becomes a zero signal after time T. In this way, second sinusoidal waveform 320 can be configured to cancel a portion of first sinusoidal waveform 310. Further, due to second sinusoidal waveform 320 canceling a portion of first sinusoidal waveform 310, first sinusoidal waveform 310 can propagate along a single direction of the power line 140 (i.e., direction A), and not along the second direction of the power line 140 (i.e., direction B).

Figure 5:
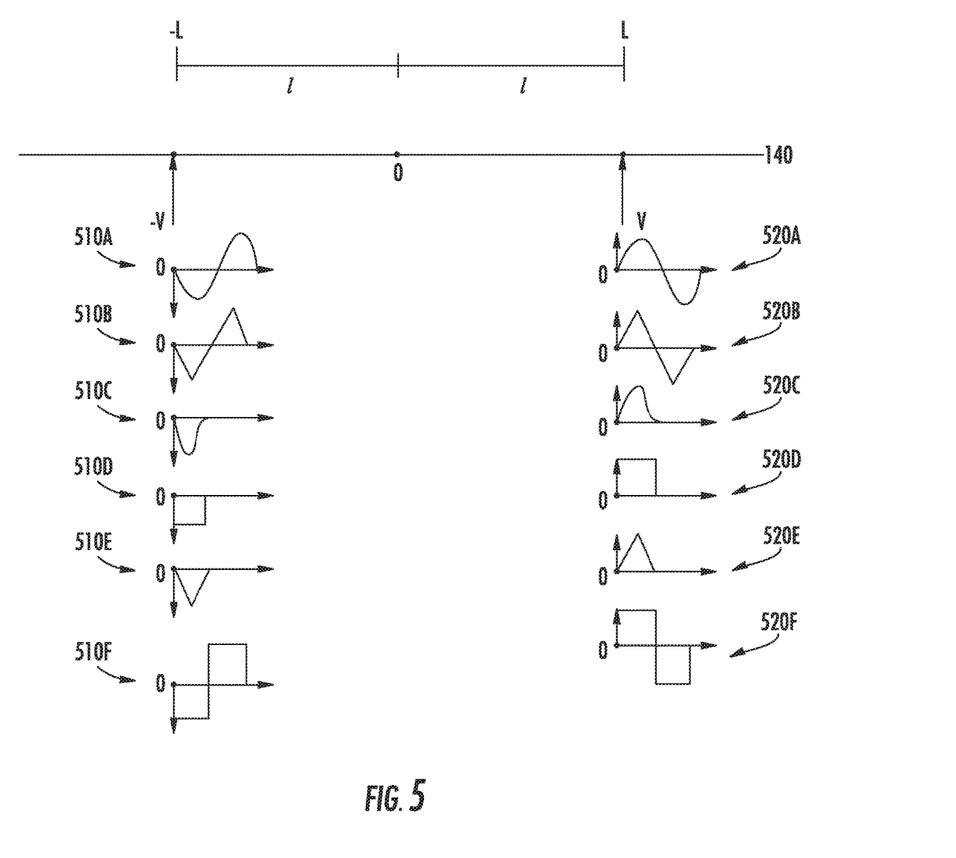
FIG. 5 depicts an example configuration for injecting a signal along a power line according to example aspects of the present disclosure.

Referring now to FIG. 5, an example configuration for injecting a signal along a power line according to example aspects of the present disclosure is depicted. For example, as shown, a power line 140 can be configured to receive both the first and second signals from the first induction coil 220A and the second induction coil 220B. First induction coil 220A and second induction coil 220B can be spaced along a power line 140 such that first signal 510 and second signal 520 can both be injected onto the power line 140 at approximately the same time. For example, the induction coils 220 can be spaced on the power line 140 such that they are equally spaced a distance +L and −L from a midpoint O.

First signal 510 can be injected at first induction site −L and second signal 520 can be injected at second induction site +L. First signal 510 can be, for example, a sinusoidal waveform 510A, a triangular waveform 510B, a sinusoidal pulse 510C, a square wave pulse 510D, a triangular pulse 510E, a square waveform 510F, or another signal (not shown). The first signal 510 can have an amplitude of −V. In order to cancel a portion of a first signal, a second signal 520 can be of the same type of signal as the first signal 510, and can similarly be, for example, a sinusoidal waveform 520A, a triangular waveform 520B, a sinusoidal pulse 520C, a square wave pulse 520D, a triangular pulse 520E, a square waveform 520F, or another signal (not shown). The second signal 520 can have an amplitude of +V. As shown, first signal 510 and second signal 520 can be 180° out of phase, and have the same frequency. Similarly, other signals can be used provided that the second signal 520 cancels out a portion of a first signal 510, and as a result, the first signal 510 is configured to propagate in a single direction on the power line 140.

In an embodiment, a control device such as a control device 230, can be configured to inject both first signal 510 and second signal 520 at approximately the same time. In another embodiment, the control device 230 can be configured to delay the second signal 520 such that the second signal 520 cancels a portion of the first signal 510, and as a result, the first signal 510 is configured to propagate in a single direction along the power line 140.

Figure 6:
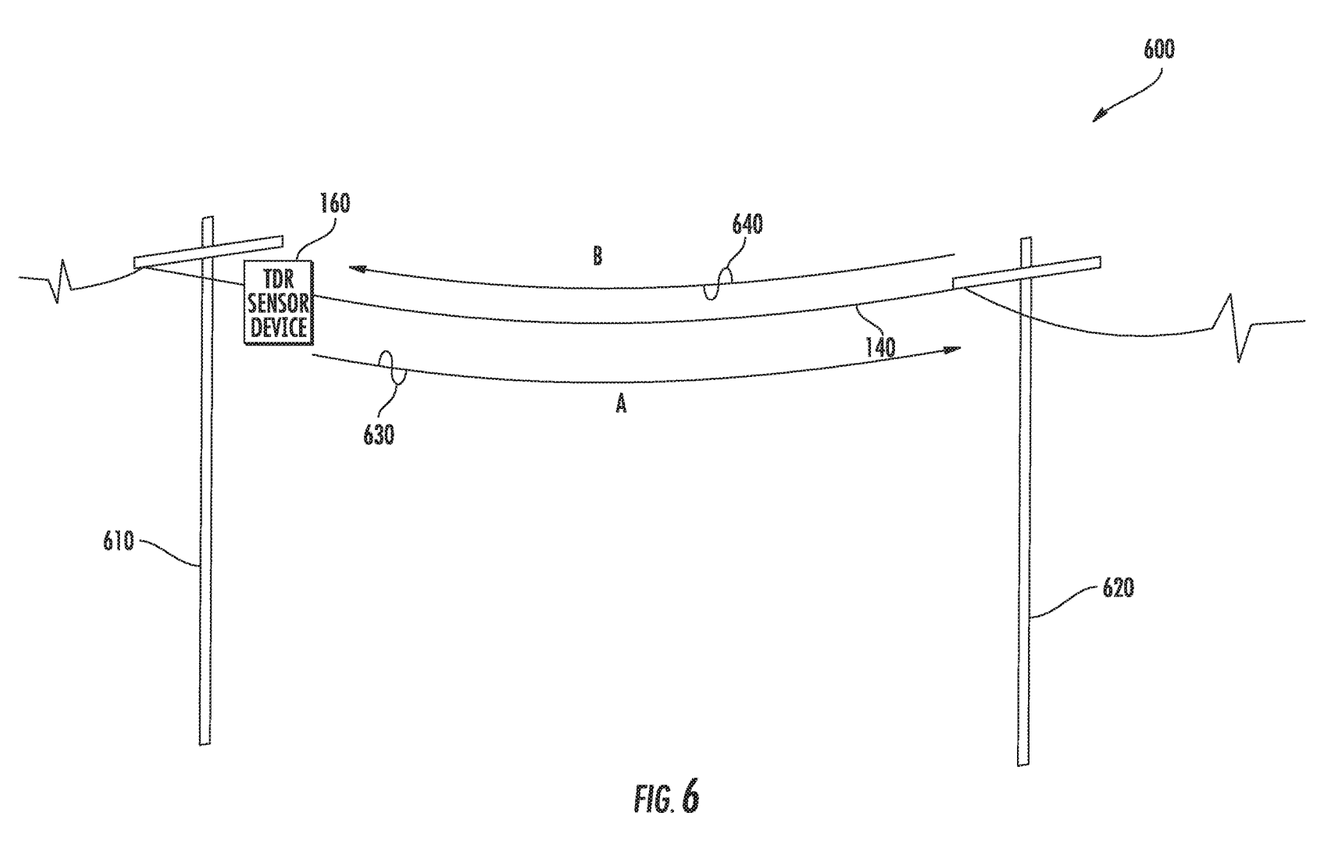
FIG. 6 depicts an example use for an example TDR sensor device according to example aspects of the present disclosure.

Referring now to FIG. 6, an example system 600 showing a use of an example TDR sensor device according to example aspects of the present disclosure is depicted. As shown, a TDR sensor device 160 can be coupled to a power line 140. The power line 140 can be suspended between a first power pole 610 and a second power pole 620. The length of the power line 140 suspended between the first power pole 610 and the second power pole 620 can define a "span" of the power line. The TDR sensor device 160 can be coupled to the power line 140 when the power line 140 is in operation, that is, when power is flowing through the power line 140. Using the methods described herein, the TDR sensor device can be configured to send a signal 630 along first direction A of the power line 140. The signal 630 can propagate along the power line 140 until it reaches a discontinuity in the power line 140. For example, a discontinuity can be due to a fault condition, such as a foreign object contact with the power line as may occur when a tree falls into the power line. Additionally, a discontinuity can exist at each power pole. For example, one or more insulators (not shown) insulating the power line 140 from the second power pole 620 can cause at least a portion of the signal 630 to reflect back to the TDR sensor device 160 from the second power pole 620 as a reflected signal 640 along the second direction B. The TDR sensor device 160 can be configured to determine a parameter of the power line 140 based at least in part on the reflected signal 640. For example, the TDR sensor device 160 can be configured to determine a first time duration of the reflected signal 640.

Figure 7:
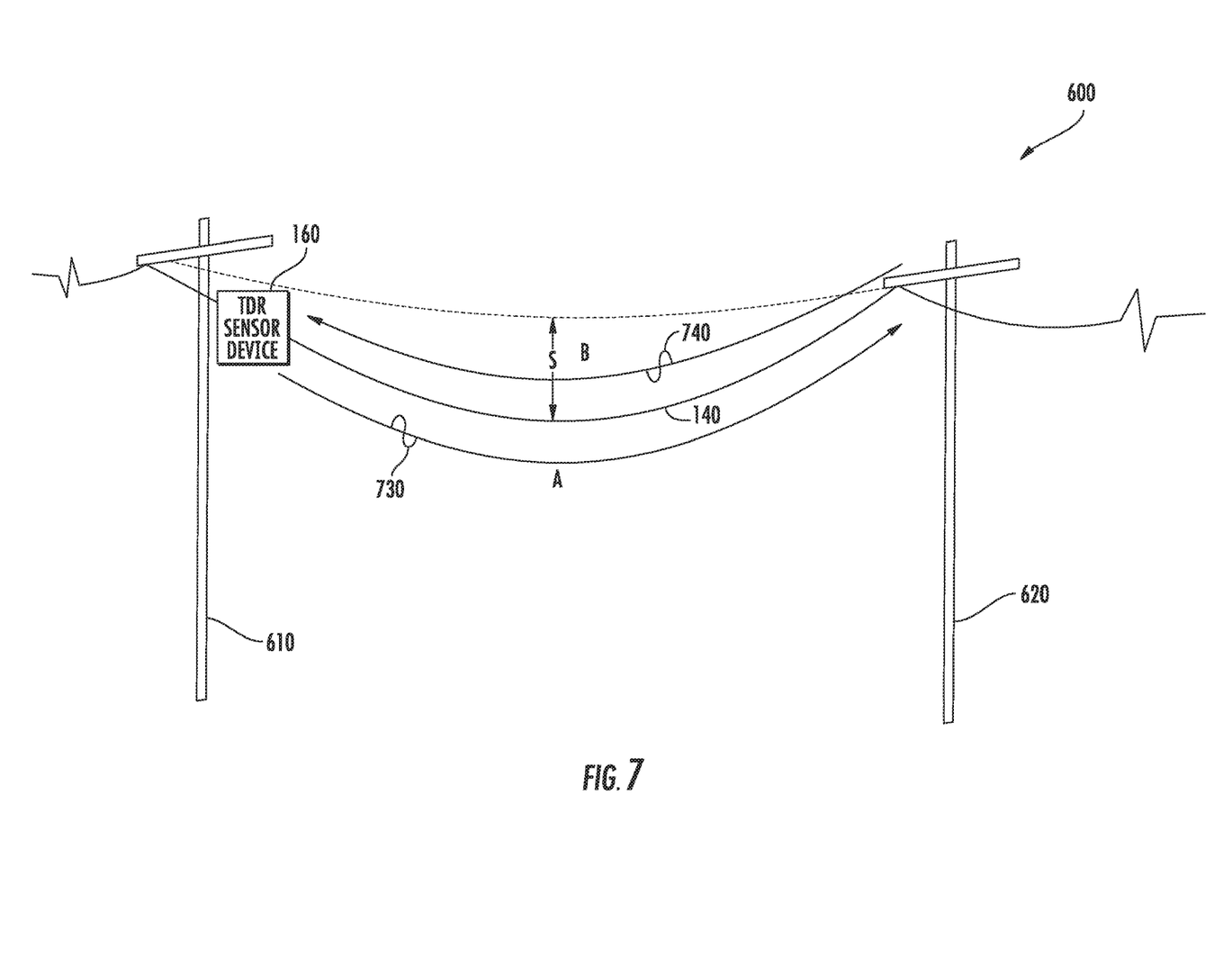
FIG. 7 depicts an example use for an example TDR sensor device according to example aspects of the present disclosure.

Referring now to FIG. 7, the same system 600 depicted in FIG. 6 is shown. Elements that are the same or similar to those depicted in FIG. 6 are referred to with the same reference numerals. However, as shown in FIG. 7, the power line 140 has sagged by an amount S. This can be due to, for example, lengthening effects caused by an increase in the temperature in the power line 140. For example, due to environmental conditions and/or resistive heating of the power line 140 due to power flowing through the power line 140, the power line 140 may heat up and therefore lengthen. As the power line 140 lengthens, the power line 140 can sag. The TDR sensor device 160 can send a second signal 730 along the power line 140 in the direction A, at least a portion of which can reflect off of the second power pole 620 as a second reflected signal 740 back to the TDR sensor device 160. The TDR sensor device 160 can be configured to determine a time second duration of the reflected signal 740, which for a lengthened span, will be greater than the first time duration of the reflected signal 640.

Using known relationships between temperature, length of a power line 140 or a portion thereof, and sag of a power line 140, a control device or a control system can be configured to determine the amount of the sag S based on the difference between the first time duration of the reflected signal 640 and the second time duration of the reflected signal 740. Further, a control device, such as a control device 230, or a control system, such as a control system 170, can be configured to determine one or more operational parameters of a power line 140. For example, a control system 170 can be configured to determine that the power rating of a power line 140 should be reduced according to applicable standards due to thermal issues caused by the amount of sag S.

Additionally, as discussed herein, the TDR sensor device 160 can similarly be configured to determine other parameters of a power line 140, such as a temperature of the power line 140, the length of the power line 140 or a portion thereof, or a fault condition of the power line. Further, parameters for a plurality of portions of a power line 140, such as successive spans of the power line 140, can similarly be determined using a plurality of reflected signals 640/740. In this way, the TDR sensor device 160 according to example aspects of the present disclosure can be used to determine one or more parameters of a power line 140, and further, be configured to communicate that parameter to a control system, such as a control system 170.

Figure 8:
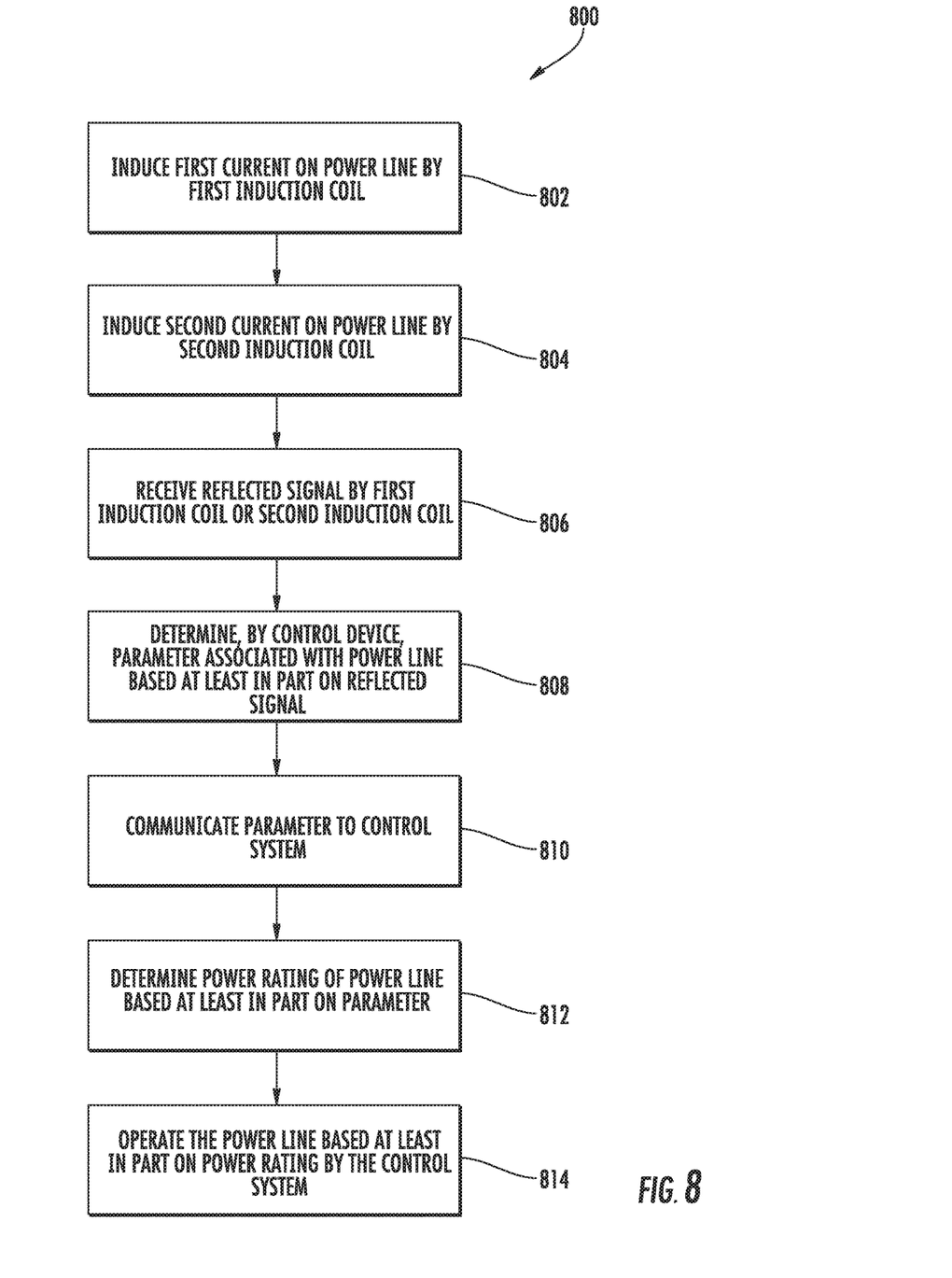
FIG. 8 depicts an example method according to example aspects of the present disclosure.

Referring now to FIG. 8, a method (800) for determining a parameter of a power line is depicted. At (802) the method (800) can include inducing, by a first induction coil of a first sensor device coupled to the power line, a first current to inject a first signal on the power line. The first induction coil can be, for example, a first induction coil 220A of a first TDR sensor device 160. The TDR sensor device 160 can be coupled to a power line, such as a power line 140.

At (804), the method (800) can include inducing, by a second induction coil of the first sensor device, a second current to inject a second signal on the power line. For example, the second current can be induced by a second induction coil 220B of a TDR sensor device 160 coupled to the power line 140. The second signal can be configured to cancel a portion of the first signal such that the first signal is configured to propagate in a single direction on the power line. For example, the second signal can be a second signal 180° out of phase with the first signal.

At (806), the method (800) can include receiving a reflected signal by the first induction coil or the second induction coil of the first sensor device. For example, the first signal can propagate along a power line 140 until it reaches a discontinuity in the power line 140. The discontinuity can be, for example, discontinuity caused by a fault condition, a power pole at the end of a span of the power line 140, or any other discontinuity. At least a portion of the first signal can reflect off of the discontinuity back towards the TDR sensor device 160. Either a first induction coil 220A or a second induction coil 220B of the TDR sensor device 160 can receive the reflected signal.

At (808), the method (800) can include determining, by a control device, a parameter associated with the power line based at least in part on the reflected signal. For example, a control device, such as a control device 230 can be configured to determine a parameter associated with the power line 140. The parameter can be, for example, a time duration of the reflected signal, a length of at least a portion of the power line, a temperature of the power line, a sag of the power line, or a fault condition of the power line. For example, using known relationships between the time it takes for a signal to propagate along a power line 140 and known discontinuities, such as at the end of individual spans of the power line 140, the length of individual spans of a power line can be determined based at least in part on the time duration of a reflected signal. Further, using known relationships between and the length of a power line 140 and other parameters, such as the temperature of the power line 140 and the sag of a power line 140, these additional parameters can be determined. Moreover, when the time duration of a reflected signal falls outside of threshold time duration associated with known discontinuities, such as discontinuities associated with individual spans of the power line 140, a fault condition can be determined, such as a fault condition corresponding to a foreign object contact with the power line. In this way, one or more parameters associated with a power line 140 can be determined.

At (810), the method (800) can include communicating the parameter to a control system. For example, a communication module 270 of a TDR sensor device 160 can be configured to communicate via one or more wired or wireless networks to a control system 170. In an embodiment, the first TDR sensor device 160 can be configured to communicate with a second TDR sensor device 160, such as a second TDR sensor device 160B, which can be configured to communicate the parameter associated with the power line 140 to the control system 170.

At (812), the method (800) can include determining a power rating of the power line based at least in part on the parameter associated with power line. For example, a parameter associated with the power line 140 can be a time duration of a reflected signal. A control system 170 can be configured to determine a sag of the power line 140 based at least in part on the time duration of the reflected signal. Further, a control system 170 can be configured to determine a power rating in accordance with applicable standards to ensure that the sag of the power line falls within an acceptable threshold. For example, a control system 170 can reduce the power rating for a power line 140 in order to reduce the current flowing through and associated resistive heating of the power line 140. Accordingly, the temperature of the power line 140 can be reduced, which can reduce the length and associated sag of the power line 140 in order for the power line 140 to be operated with an acceptable sag amount.

At (814), the method (800) can include operating, by the control system, the power line based at least in part on the power rating. For example, a control system 170 can determine a dispatch for one or more generators in a power system in order to control power flows in the power system such that the power flows do not exceed the power rating for the power line 140. In this way, the control system 170 can operate the power line 140 based at least in part on the power rating.

Figure 9:
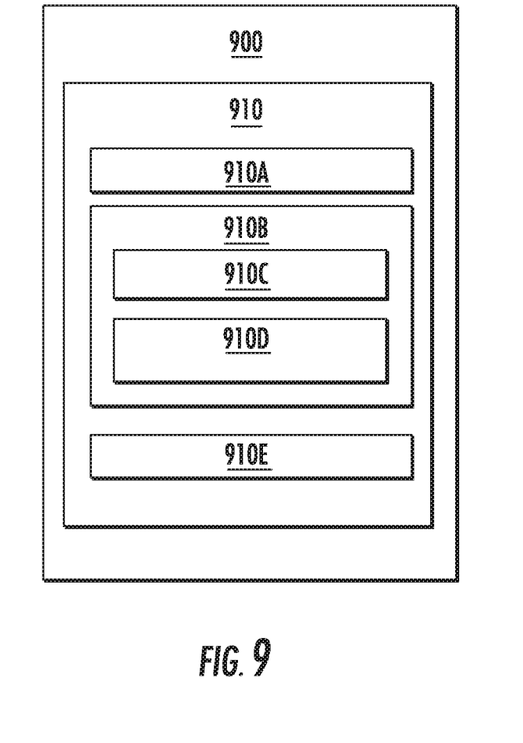
FIG. 9 depicts elements suitable for use as a control device according to example aspects of the present disclosure.

FIG. 9 depicts an example computing system 900 according to example embodiments of the present disclosure. The computing system 900 can be used, for example, as a control system 170 or a control device 230. The computing system 900 can include one or more computing device(s) 910. The computing device(s) 910 can include one or more processor(s) 910A and one or more memory device(s) 910B. The one or more processor(s) 910A can include any suitable processing device, such as a microprocessor, microcontrol device, integrated circuit, logic device, and/or other suitable processing device. The one or more memory device(s) 910B can include one or more computer-readable media, including, but not limited to, non-transitory computer-readable media, RAM, ROM, hard drives, flash drives, and/or other memory devices.

The one or more memory device(s) 910B can store information accessible by the one or more processor(s) 910A, including computer-readable instructions 910C that can be executed by the one or more processor(s) 910A. The instructions 910C can be any set of instructions that when executed by the one or more processor(s) 910A, cause the one or more processor(s) 910A to perform operations. In some embodiments, the instructions 910C can be executed by the one or more processor(s) 910A to cause the one or more processor(s) 910A to perform operations, such as any of the operations and functions for which the computing system 900 and/or the computing device(s) 910 are configured, the operations for determining a parameter of a power line and/or operating a power line (e.g., method 800), as described herein, and/or any other operations or functions of the one or more computing device(s) 910. The instructions 910C can be software written in any suitable programming language or can be implemented in hardware. Additionally, and/or alternatively, the instructions 910C can be executed in logically and/or virtually separate threads on processor(s) 910A. The memory device(s) 910B can further store data 910D that can be accessed by the processor(s) 910A. For example, the data 910D can include data indicative a parameter of a power line, such as a time duration of a reflected signal, a length of a power line, a temperature of a power line, a sag of a power line, a fault condition of a power line, or another parameter, such as a power rating for a power line, a dispatch pattern for generators in a power system, or any other data and/or information described herein.

The computing device(s) 910 can also include a network interface 910E used to communicate, for example, with the other components of system 900 (e.g., via a network). The network interface 910E can include any suitable components for interfacing with one or more network(s), including for example, transmitters, receivers, ports, control devices, antennas, and/or other suitable components. For example, the network interface 910E can be configured to communicate with one or more communication modules 270 in a TDR sensor device 160.

The technology discussed herein makes reference to computer-based systems and actions taken by and information sent to and from computer-based systems. One of ordinary skill in the art will recognize that the inherent flexibility of computer-based systems allows for a great variety of possible configurations, combinations, and divisions of tasks and functionality between and among components. For instance, processes discussed herein can be implemented using a single computing device or multiple computing devices working in combination. Databases, memory, instructions, and applications can be implemented on a single system or distributed across multiple systems. Distributed components can operate sequentially or in parallel.

Although specific features of various embodiments may be shown in some drawings and not in others, this is for convenience only. In accordance with the principles of the present disclosure, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A sensor device for a power line, comprising:
   a first induction coil coupled to the power line, the first induction coil configured to inject a first signal on a power line by inducing a first current on the power line;
   a second induction coil coupled to the power line, the second induction coil configured to inject a second signal on the power line by inducing a second current on the power line; and
   a control device;
   wherein the control device is configured to control the second induction coil to inject the second signal to cancel a portion of the first signal; and
   wherein as a result of the second signal cancelling a portion of the first signal, the first signal is configured to propagate in a single direction on the power line.

2. The sensor device of claim 1, wherein at least one of the first induction coil and the second induction coil is further configured to receive a reflected signal, wherein the reflected signal comprises at least a portion of the first signal reflected back to the sensor device by a discontinuity in the power line.

3. The sensor device of claim 2, wherein the control device is further configured to determine a parameter of the power line based at least in part on the reflected signal.

4. The sensor device of claim 3, wherein the parameter comprises at least one of: a time duration of the reflected signal, a length of the power line, a temperature of the power line, a sag of the power line, or a fault condition of the power line.

5. The sensor device of claim 3, wherein the sensor device is further configured to communicate a signal indicative of the parameter of the power line to a control system.

6. The sensor device of claim 1, wherein the sensor device is further configured to be coupled to the power line when the power line is transmitting power; and
   wherein the sensor device is configured to be powered from power received from the power line.

7. The sensor device of claim 6, further comprising:
an energy storage device configured to store power received from the power line.

8. The sensor device of claim 1, further comprising:
a first filter and a first amplifier associated with the first induction coil; and
a second filter and a second amplifier associated with the second induction coil;
wherein each filter is configured to filter a power waveform from a reflected signal; and
wherein each amplifier is configured to amplify an induced current to inject a signal or amplify a reflected signal received by an induction coil.

9. The sensor device of claim 1, wherein the first signal and the second signal each comprise a high frequency induced current.

10. A method for determining a parameter of a power line, comprising:
inducing, by a first induction coil of a first sensor device coupled to the power line, a first current to inject a first signal on the power line;
inducing, by a second induction coil of the first sensor device, a second current to inject a second signal on the power line, wherein the second signal is configured to cancel at least a portion of the first signal such that the first signal is configured to propagate in a single direction on the power line;
receiving, by either the first induction coil or the second induction coil of the first sensor device, a reflected signal, the reflected signal comprising at least a portion of the first signal reflected back to the sensor device by a discontinuity in the power line; and
determining, by a control device, a parameter associated with the power line based at least in part on the reflected signal.

11. The method of claim 10, further comprising:
communicating the parameter associated with the power line to a control system.

12. The method of claim 11, wherein communicating the parameter associated with the power line to a control system comprises:
communicating the parameter associated with the power line from a first sensor device to a second sensor device; and
communicating the parameter associated with the power line from the second sensor device to the control system.

13. The method of claim 10, further comprising:
determining, by the control system, a power rating of the power line based at least in part on the parameter associated with the power line.

14. The method of claim 13, further comprising:
operating, by the control system, the power line based at least in part on the power rating.

15. The method of claim 10, wherein determining, by the control device, a parameter associated with the power line based at least in part on the reflected signal comprises determining at least one of a time duration of the reflected signal, a length of at least a portion of the power line, a temperature of the power line, a sag of the power line, or a fault condition of the power line.

16. A power system, comprising:
a first power line;
a first sensor device coupled to the first power line; and
a control system;
wherein the first sensor device comprises:
a first induction coil coupled to the power line, the first induction coil configured to inject a first signal on a power line by inducing a first current on the power line;
a second induction coil coupled to the power line, the second induction coil configured to inject a second signal on the power line by inducing a second current on the power line; and
a control device;
wherein the control device is configured to control the second induction coil to inject the second signal to cancel a portion of the first signal;
wherein as a result of the second signal cancelling a portion of the first signal, the first signal is configured to propagate in a single direction on the power line;
wherein at least one of the first induction coil and the second induction coil is configured to receive a reflected signal; and
wherein the reflected signal comprises at least a portion of the first signal reflected back to the first sensor device by a discontinuity in the first power line.

17. The power system of claim 16, wherein the control device of the first sensor is configured to determine a parameter associated with the first power line based at least in part on the reflected signal; and
wherein the parameter associated with the first power line comprises at least one of: a time duration of the reflected signal, a length of at least a portion of the first power line, a temperature associated with the first power line, a sag of the first power line, or a fault condition of the first power line.

18. The power system of claim 17, wherein the first sensor device is further configured to communicate the parameter associated with the first power line to the control system.

19. The power system of claim 18, wherein the control system is configured to determine a power rating for the first power line based at least in part on the parameter associated with the first power line, and
wherein the control system is further configured to operate the first power line based at least in part on the power rating.

20. The power system of claim 18, further comprising:
a second power line; and
a second sensor device coupled to the second power line;
wherein the first sensor device is configured to communicate the parameter associated with the first power line to the control system by communicating the parameter associated with the first power line to the second power sensor device, and
the second sensor device is configured to communicate the parameter associated with the first power line to the control system.

* * * * *